(12) United States Patent
Shan et al.

(10) Patent No.: US 10,516,085 B2
(45) Date of Patent: Dec. 24, 2019

(54) DEVICES AND METHODS INCLUDING AN LED AND REFLECTIVE DIE ATTACH MATERIAL

(71) Applicant: Luminus, Inc., Sunnyvale, CA (US)

(72) Inventors: Qifeng Shan, San Jose, CA (US); Hongtao Ma, Campbell, CA (US); Tao Tong, Fremont, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 14/830,814

(22) Filed: Aug. 20, 2015

(65) Prior Publication Data

US 2016/0056353 A1 Feb. 25, 2016

Related U.S. Application Data

(60) Provisional application No. 62/040,370, filed on Aug. 21, 2014.

(51) Int. Cl.
| | |
|---|---|
| *H01L 33/50* | (2010.01) |
| *H01L 33/60* | (2010.01) |
| *H01L 25/075* | (2006.01) |
| *H01L 33/64* | (2010.01) |
| *H01L 33/46* | (2010.01) |

(52) U.S. Cl.
CPC .......... *H01L 33/60* (2013.01); *H01L 25/0753* (2013.01); *H01L 33/46* (2013.01); *H01L 33/641* (2013.01); *H01L 33/642* (2013.01); *H01L 2924/0002* (2013.01); *H01L 2933/0025* (2013.01); *H01L 2933/0058* (2013.01); *H01L 2933/0075* (2013.01)

(58) Field of Classification Search
CPC ............... H01L 2924/12041; H01L 33/60
See application file for complete search history.

(56) References Cited

U.S. PATENT DOCUMENTS

| | | | |
|---|---|---|---|
| 5,644,103 A * | 7/1997 | Pullen | H05K 1/141 |
| | | | 174/541 |
| 7,598,531 B2 | 10/2009 | Erchak et al. | |
| 8,217,415 B2 | 7/2012 | Erchak et al. | |
| 8,872,217 B2 | 10/2014 | Brown et al. | |
| 9,960,329 B2 * | 5/2018 | Shan | H01L 33/46 |
| 2005/0017252 A1 | 1/2005 | Streubel et al. | |
| 2007/0200133 A1 | 8/2007 | Hashimoto et al. | |

(Continued)

OTHER PUBLICATIONS

Chen et al., Thermal Management and Novel Package Design of High Power Light-Emitting Diodes. 58th Electronic Components and Technology Conference. IEEE. May 27, 2008:3 pages.

(Continued)

*Primary Examiner* — Bradley Smith
*Assistant Examiner* — David J Goodwin
(74) *Attorney, Agent, or Firm* — Wolf, Greenfield & Sacks, P.C.

(57) ABSTRACT

Devices and methods including an LED and reflective die attach material are described herein. The devices can include a reflective substrate (e.g., a substrate that includes a silver layer) to which one or more LED die are attached using the die attach material. The die attach material extends beyond the periphery of the LED die to cover an area of the substrate surface.

14 Claims, 6 Drawing Sheets

(56) References Cited

U.S. PATENT DOCUMENTS

| | | | |
|---|---|---|---|
| 2008/0254650 A1* | 10/2008 | Kadotani | H01L 33/54 |
| | | | 439/56 |
| 2008/0291633 A1 | 11/2008 | Tuan et al. | |
| 2008/0315239 A1* | 12/2008 | Lin | H01L 21/486 |
| | | | 257/99 |
| 2011/0163348 A1* | 7/2011 | Lin | H05K 1/021 |
| | | | 257/99 |
| 2011/0287563 A1 | 11/2011 | Lin et al. | |
| 2013/0087825 A1* | 4/2013 | Umakoshi | H01L 33/60 |
| | | | 257/99 |
| 2013/0193455 A1 | 8/2013 | Andrews et al. | |
| 2014/0196934 A1 | 7/2014 | Kawagoe et al. | |
| 2015/0166847 A1* | 6/2015 | Morita | H01L 33/46 |
| | | | 257/98 |
| 2015/0311403 A1* | 10/2015 | Katoh | H01L 33/486 |
| | | | 257/98 |
| 2016/0172558 A1 | 6/2016 | Liu | |

OTHER PUBLICATIONS

Kim et al., Thermal transient characteristics of die attach in high power LED PKG. Microelectronics Reliability. 2008;48:445-54. Epub Oct. 22, 2007.

Su et al., Novel Package Technology of Ultra High Power Light-Emitting Diodes by Electroplating. Compound Semiconductor Integrated Circuit Symposium. IEEE. Oct. 2, 2007:4 pages.

* cited by examiner

DEVICES AND METHODS INCLUDING AN LED AND REFLECTIVE DIE ATTACH MATERIAL

CROSS REFERENCE TO RELATED APPLICATIONS

This application claims priority under 35 U.S.C. § 119 to U.S. Provisional Application No. 62/040,370 entitled "RELIABLE LED PACKAGES USING HIGHLY REFLECTIVE DIE ATTACH MATERIAL AND ENHANCED AG SUBSTRATES," filed on Aug. 21, 2014, the subject matter of which is incorporated herein by reference.

TECHNICAL FIELD

The present invention relates generally to light-emitting diodes (LEDs) and, more particularly, to LED devices and methods that include reflective die attach material.

BACKGROUND

Development in light-emitting diode (LED) lighting technology continues to take place at a dramatic pace. With improved brightness, lower energy consumption and longer life spans, the global market for LED lighting has grown exponentially. Further improvements in LED performance (e.g. efficiency, long-term reliability, etc.) is desired. This is particularly true for high power LEDs, which may operate under demanding conditions for long hours.

To improve efficiency, highly reflective substrates are widely used for high performance LED packages and modules (e.g., chip-on-board (COB) LED packages). However, such highly reflective substrates can lead to long-term reliability issues that reduce device life span. For example, silver, which is widely used in high reflective substrates due to its high reflectivity, may migrate and/or be oxidized during operation which can tarnish and/or degrade the substrate. Moreover, the speed of degradation accelerates dramatically at higher temperatures.

In an LED device, one or more LED die may be attached to a highly reflective substrate. During operation, the LED dies generate heat which can raise the temperature of the reflective layer in the vicinity of the die and can accelerate the tarnishing and/or degradation effects noted above. Such effects can lead to reliability problems.

LED device designs that improve performance and long-term reliability are desirable.

SUMMARY

Devices and methods including an LED and reflective die attach material are described herein.

In one aspect, a light emitting device is provided. The light emitting device comprises a substrate including a reflective region disposed at a top surface of the substrate. The reflective region comprises at least one reflective layer. The device further comprises a light emitting diode having a periphery defined by edges. The device further comprises a die attach covering a portion of the top surface of the substrate. The die attach attaches the light emitting diode to the top surface of the substrate. The die attach comprises reflective material and extends beyond the periphery of the light emitting diode to cover an area of the top surface of the substrate that is outside the periphery of the light emitting diode.

In another aspect, a method of forming a light emitting device is provided. The method comprises providing a substrate including a reflective region disposed at a top surface of the substrate. The reflective region comprises at least one reflective layer. The method further comprises attaching a light emitting diode having a periphery defined by edges to the top surface of the substrate with a die attach. The die attach covers a portion of the top surface of the substrate. The die attach comprises reflective material and extends beyond the periphery of the light emitting diode to cover an area of the top surface of the substrate that is outside the periphery of the light emitting diode.

Further aspects, details and embodiments are described in the detailed description below.

BRIEF DESCRIPTION OF THE DRAWINGS

The accompanying drawings, where like numerals indicate like components, illustrate embodiments of the invention.

DETAILED DESCRIPTION

Devices and methods including an LED and reflective die attach material are described herein. The devices can include a reflective substrate (e.g., a substrate that includes a silver layer) to which one or more LED die are attached using the die attach material. The die attach material extends beyond the periphery of the LED die to cover an area of the substrate surface. During operation, the die attach material can reflect light (e.g., generated by the LED die) which otherwise may lead to degradation of the substrate and cause device reliability problems over time. In some embodiments, the die attach material is opaque and/or can include heat conductive particles which can help dissipate heat generated by the device. As described further below, in some embodiments, thermal modeling may be used to determine the area on the substrate surface over which the die attach material extends. Such modeling may be used to determine how heat is generated and spread across the substrate during use and, thus, which areas would benefit most from being covered with the die attach material to limit substrate degradation.

Figure 1:
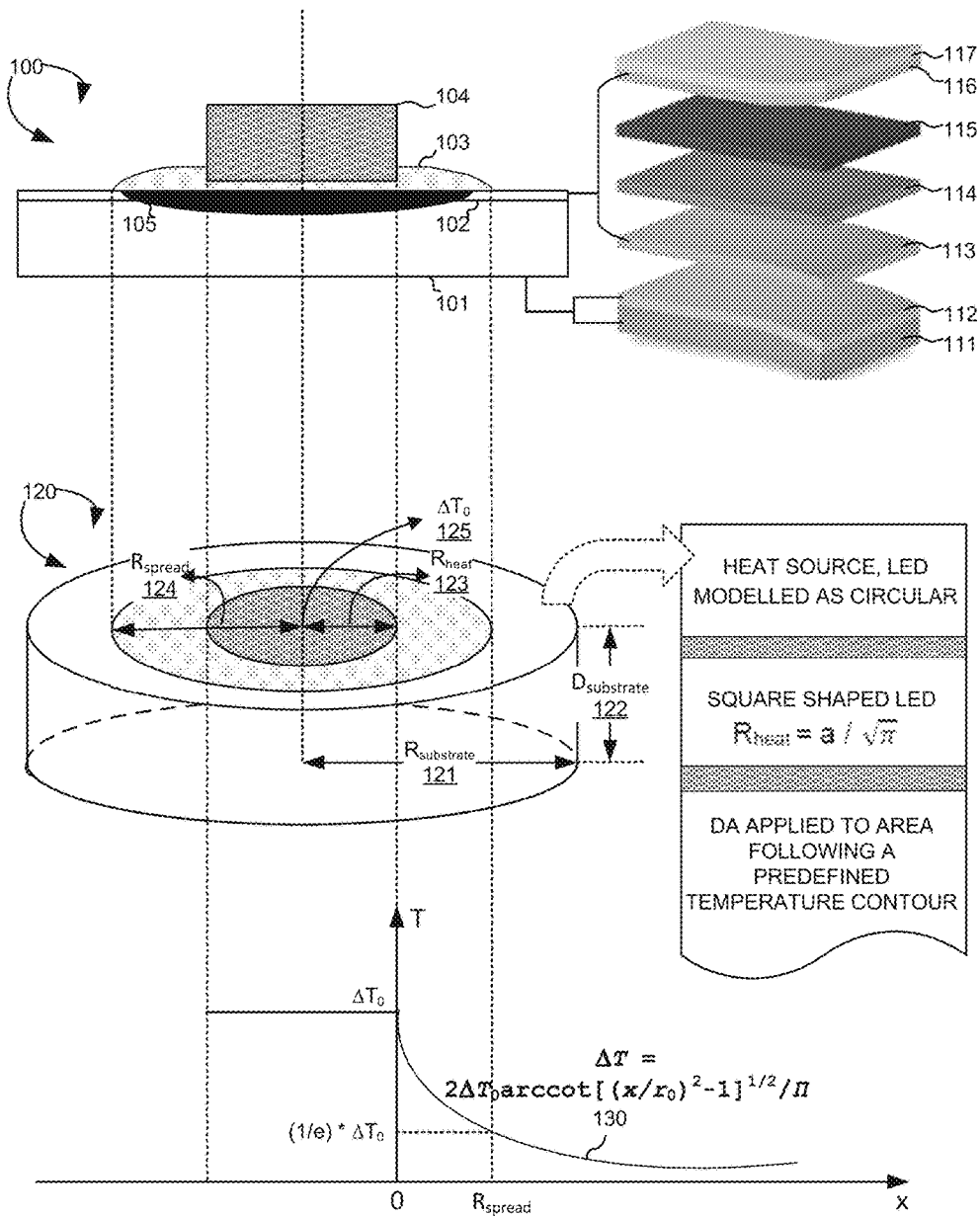
FIG. 1 is a perspective view of an LED assembly 100 and the heat distribution protection modeling in accordance with some embodiments.

FIG. 1 is a perspective view of a device 100 and its temperature distribution protection modeling in accordance with embodiments. The device includes a substrate comprised of a substrate layer 101 and a reflective region 102.

The device further includes a die attach (DA) 103 that attaches an LED 104 to the substrate.

Substrate layer 101 includes a base metal layer, in some embodiments. For example, substrate layer 101 can be made of aluminum. In some cases, a rectangle or square may be cut from the roll of aluminum sheet metal on which a reflective region 102 is formed. In some embodiments, the substrate layer includes more than one layer. As shown in FIG. 1, substrate layer 101 includes a base layer 111 (e.g., an aluminum base layer) and a top layer 112 (e.g., a treated aluminum layer).

In some embodiments, reflective region 102 includes a reflective layer deposited over the substrate layer. For example, the reflective layer may be a silver layer. In some cases, the silver layer may be 99.99% pure silver. The reflective layer may be formed over the substrate layer using physical vapor deposition (PVD) coating techniques such as sputtering. In some embodiments, the reflective region includes more than one layer. For example, as shown, the reflective region includes a bonding layer 113, a highly reflective layer (e.g., a silver layer) 114, a protection layer 115, and one or more protection and reflectance enhancing layers 116 and 117.

As noted above, LED 104 is attached to the substrate using die attach 103. In general, the die attach material should be able to sufficiently adhere the LED to the substrate. In some embodiment, the die attach comprises a polymeric material (e.g., silicone). The polymeric material may be transparent. In some embodiments, reflective particles are distributed in the polymeric material. For example, the particles may be $T_iO_2$, $Zr_2O_3$, $Al_2O_3$, and ZnO, and mixtures thereof. In some embodiments, the particles may be effective at conducting heat which can assist in managing heat generated by the device.

As described above, the die attach material extends beyond the periphery of the LED die to cover an area of the substrate surface. The extent of the die attach material may depend on the particular embodiment. In some cases, the die attach material extends to cover an area that is at least 20% of the area defined by the periphery of the light emitting diode; in some cases, at last 50% of the area defined by the periphery of the light emitting diode; and, in some cases at least 100% of the area defined by the periphery of the light emitting diode. As described further below, in some embodiments, thermal modeling may be used to determine which areas of the substrate are most susceptible to heating and, thus, degradation during use and the die attach material is applied to cover such areas. Such an area is shown schematically as region 105 in FIG. 1. The die attach material can reflect light which otherwise may degrade the substrate and, therefore, the die attach material can enhance reliability and extend operating life of the LED.

As noted above, in some embodiments, the size and shape of the area over which die attach is applied can be determined. Based on the determination, the amount of die attach to be applied can be determined. In some embodiments, a portion of the die attach material may be "squeezed out" during the die attaching process. That is, the portion of the die attach that extends beyond the periphery of the die is "squeezed out" during the attachment process. In other embodiments, the die attach material may be applied to the surface of the substrate (e.g., the area outside the periphery of the die) using a stamping process, screen printing or dispense process.

In some embodiments, the extended area covered by the die attach is predetermined based on temperature modeling. For example, the temperature modeling may involve determining temperature contour(s) on the substrate. In some embodiments, a long-term temperature degradation model is used to determine the area (e.g., areas most vulnerable to thermal degradation) over which the die attach material extends. The thermal modeling may involve determining a threshold temperature for a specific substrate below which the substrate should be maintained. For example, the threshold temperature can be between 90 degree Celsius and 150 degree Celsius depending on different material quality. In some embodiments, the threshold temperature is 120 degree Celsius.

FIG. 1 schematically shows a temperature distribution model 120 near LED 104. The temperature distribution may be used to determine the area over which the die attach is applied. By applying the die attach materials in the determined area, light absorption from tarnishing substrates underneath or near the LED die may be limited or even avoided. In practice, the temperature distribution on substrates can be characterized using methods such as infrared imaging or temperature measuring devices (e.g., thermocouples).

The thermal modeling can be done using known techniques. In some models, the substrate dimension can be much larger than that of an LED chip. A simplified model, assuming circular geometry for both LED and substrate, can be used to qualitatively estimate the spreading width of die attach. The substrate is simplified to be a cylinder with a radius $R_{substrate}$ 121 and a thickness of $D_{substrate}$ 122.

The heat source LED 104 is simplified to be a circular source with a radius of $R_{heat}$ 123. In this model, it is assumed that heat transfer is mainly through conduction through the substrate. When $R_{heat} \ll D_{substrate}$, the distribution of temperature increase over the reference temperature ΔT can be written as:

$$\Delta T = 2\Delta T_0 \mathrm{arccot}[(X/r_0)^2-1]^{1/2}/\pi.$$

$\Delta T_0$ is the temperature increase underneath LED 104 over the reference temperature (i.e., temperature of the substrate far away from the LED). $r_0$ equals $R_{heat}$. X is the distance between the center of LED 104 and the measured point. $\Delta T_0$ is determined by the thermal resistance of the DA, which includes the contact thermal resistance and the thermal resistance of the material itself. The thermal resistance of the material mainly depends on the thickness of the die attach material, which can be controlled during the process. The temperature contour can be, thereby, modeled using the temperature distribution model.

In one embodiment, the area of coverage is defined as the area between edges of LED 104 and the isothermal line where the temperature is 1/e of $\Delta T_0$ (i.e., significant temperature drop). The spreading radius can be estimated as x to be around $1.83 * R_{heat}$. Based on the characteristic of the temperature distribution, further enhancements can be made for the die attache to alleviate the degradation of the substrate near the LED mounting area. Such enhancements are based, at least in part, on different temperature distributions for different types of LEDs and different layouts.

FIG. 1 further shows a temperature distribution diagram 130 using the simplified model 120. Diagram 130 shows the temperature distribution over the distance from edges of LED 104. Underneath the LED, the temperature of the substrate is raised to $\Delta T_0$. The temperature drops as moving away from edges of the LED. The temperature distribution follows the model distribution equation for model 120. At distance $R_{spread}$, the temperature increase drops to be $((1/e)*\Delta T_0)$. When $X > R_{spread}$, the temperature raised by the heat source is smaller than (1/e) of $\Delta T_0$. Thereby, the effect of the heat to the reflective layer is greatly reduced. The temperature in the area beyond $R_{spread}$ is much lower than that right underneath LED 104. Therefore, the area beyond $R_{spread}$ takes much longer time to degrade. Accordingly, the die attach is not needed in the areas beyond $R_{spread}$.

Figure 2:
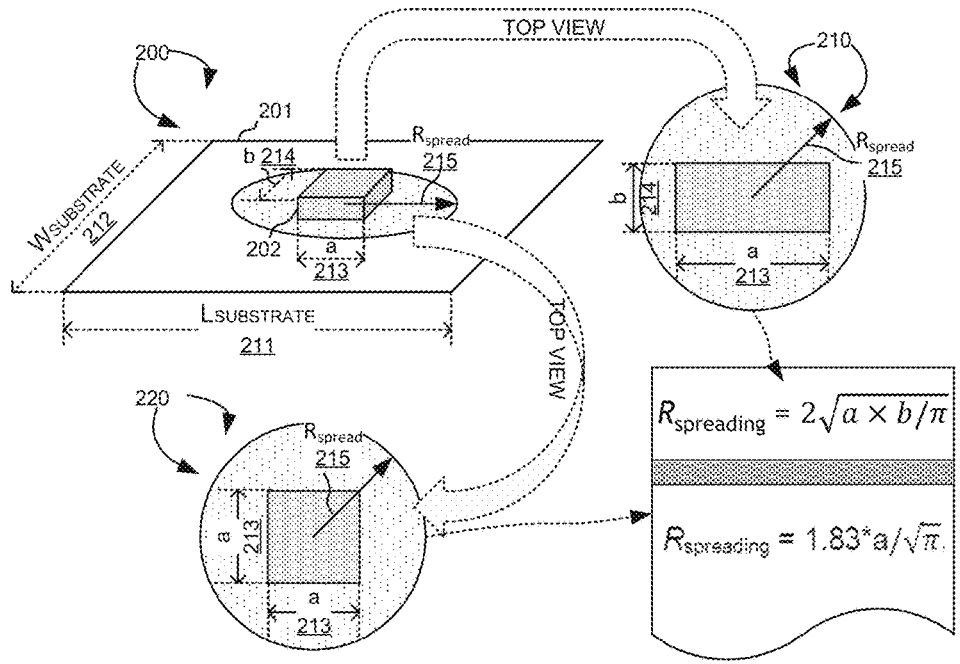
FIG. 2 shows exemplary calculations for temperature distribution of different types of LEDs in accordance with some embodiments.

FIG. 2 shows exemplary calculations for temperature distribution of different types of LEDs. An exemplary LED device 200 has a substrate 201 and an LED 202. Substrate 201 is modelled as a rectangle with sizes of $L_{substrate}$ 211 and $W_{substrate}$ 212. LED 202 is also modelled as a rectangle with sizes of a 213 and b 214. For a rectangular or square shaped LED, as long as the substrate length is much larger than the LED and the two edges are close to each other, the isothermal contour is approximately circular in shape.

A top view 210 of LED device 200 is shown. LED 202 with a length a 213 and a width b 214 has edge lengths close to each other. The isothermal line is approximately circular in shape. Assuming $L_{substrate}$ 211 and $W_{substrate}$ 212 are much larger than length a 213 and width b 214, the isothermal line follows the temperature distribution model 120. In some embodiments, a predefined isothermal line, which has a temperature increase dropped to 1/e of the temperature increase at edges of LED 202, is determined using temperature distribution modeling. An isothermal contour can be also modeled using finite element analysis, where the problem domain is discretized and represented by an assembly of finite elements. In some embodiments, $R_{heat}$ is close to $\sqrt{a \times b/\pi}$. For example, in some embodiments, the shape of the LED is a rectangle with a length and a width of a and b, and the upper limit of the isothermal line is a circle centered at a center of the LED and with a radius of around $\sqrt{a \times b/\pi}$. In some embodiments, the shape of the LED is a square with a length of a, and wherein the upper limit of the predefined isothermal line is a circle centered at a center of the LED and with a radius of around 1.03a.

A top view 220 of LED device 200 is also shown as a special case of when LED 202 is a square. LED 202 is a square with an edge size of a 213. Because the edges are all equal, the isothermal line is a circular shape. Assuming $L_{substrate}$ 211 and $W_{substrate}$ 212 are much larger than size a 213, the isothermal line follows the temperature distribution model 120. In some embodiments, a predefined isothermal line, which has a temperature increase dropped to 1/e of the temperature increase at edges of LED 202, is determined using temperature distribution model. Isothermal contour can be modeled using finite element analysis. In one embodiment, $R_{spreading}$ is close 1.83*a/$\sqrt{\pi}$.

Figure 3:
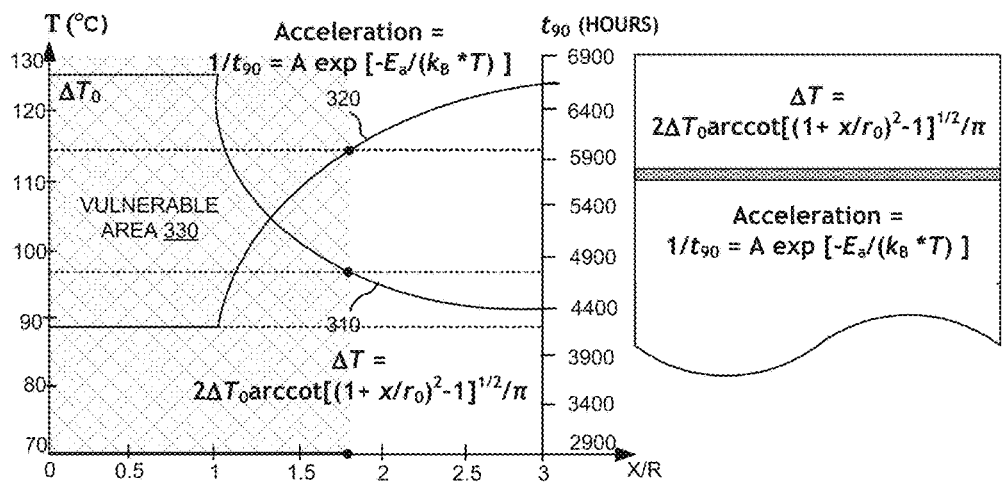
FIG. 3 shows exemplary diagrams of substrate degradation vs. distance from the LED edge in accordance with some embodiments.

FIG. 3 shows exemplary diagrams of substrate degradation vs. distance from the LED edge. Enhancements can be made to use highly reflective opaque die attaches based on the distance from the LED edge.

A substrate surface temperature distribution diagram 310 shows the temperature distribution with the distance from the LED edge. In a simplified model, diagram 310, similar to diagram 130, is expressed as:

$$\Delta T = 2 * \Delta T_0 * \text{arccot}[(x/r_0)^2 - 1]^{1/2}/\pi$$

$\Delta T_0$ is the temperature underneath LED and x is the distance from the edge of the LED. The x-axis is $x/r_0$, where $r_0$ is the radius of the heat source LED. As shown in diagram 310, the temperature decreases rapidly away from the edge of the LED die. Therefore, when in operation, areas close to the edges of the LED die have higher temperature causing the substrate Ag migration and darkening while the rest of the substrate operates under normal temperature with much longer life span. In one embodiment, it is determined that when the temperature drops to (1/e) of $\Delta T_0$, the temperature is low enough not to cause any significant effect on the tarnish process of the substrate. Thereby, according to the temperature model, a length relating to the die attach material coverage is determined using this temperature distribution diagram by finding the distance x when the temperature drops to (1/e) of $\Delta T_0$. It should be understood, depending on the overall system design, other values, instead of (1/e) can be used to determine the point that the temperature is low enough. Similarly, other temperature distribution models can be used. It should also be understood that certain embodiments do not utilize any type of modeling.

In some embodiments, calibration or measurements can be used to more precisely determine the temperature contour in different scenarios. Such processes can be performed on sample LEDs in manufacturing settings or in isolated setting to obtain sample data. Once a temperature contour is generated (e.g., by theoretical modelling or sampling measurement or any other means) an isothermal line with a predefined temperature can be chosen to determine an isothermal contour area as the protected area. In one embodiment, the predefined temperature can be relative temperature to the heat source temperature $\Delta T_0$. In another embodiment, the predefined temperature can be a predefined absolute temperature threshold. Although the absolute temperature is the factor that affects the lifespan of the substrate, in practice, the relative temperature to the reference temperature (such as the temperature at the bottom of a substrate) can be used to determine the protected area. For a practical LED device, it can be desirable to control the substrate temperature (reference temperature) at a recommended level (for example, 85° C.). To achieve such substrate temperatures, a reasonable thermal management, $\Delta T_0$ can be controlled at a reasonable level.

A substrate operating life vs. distance diagram 320 shows the substrate wear-out time with the distance from the LED edge. Reflectance of the substrate is the parameter used to measure the package lifetime if substrate is the fastest failing component. The light-output power (LOP) of a package (especially a package with loaded phosphor silicone dome) is strongly dependent on the substrate reflectance. When light is bouncing back and forth in the package due to scattering on the phosphor particle, the effect of reflectance becomes more significant. For single material degradation, such as Ag migration in the case of PVD Ag substrate for an LED package, empirical Arrhenius equation is generally used to describe the degradation rate:

$$\text{Acceleration} = 1/t_{90} = A\exp[-E_a/(k_B*T)]$$

$t_{90}$ is the time when the substrate reflectance drops to 90% of initial value. $k_B$ is the Boltzmann constant and T is temperature. A and $E_a$ are fitting parameters determined by reliability data. A is a dimensionless pre-factor and $E_a$ is an energy parameter (with unit of J) reflecting how sensitive of the materials on temperature. Using this acceleration diagram and the temperature distribution equation, the time for the substrate degrading to 90% of the initial reflectance can be determine. For example, diagram 320 shows that underneath the LED, where $X/R_{heat}<1$, the reflectance of substrate suffers large degradation with $t_{90}$ less than 4200 Hours. As the temperature drops when moving away from the heat source, $t_{90}$ increases. In one embodiment, a predefined $t_{90}$ is determined. A spreading length is determined accordingly using the degradation diagram or a degradation look up table in accordance with the diagram. For example, a predefined $t_{90}$ is determined to be 6000 Hours. Diagram 320 yields that when $X/R_{heat}>1.83$, $t_{90}$ reaches the minimum of 6000 Hours. Thereby, the spreading length is 1.83*$R_{heat}$. Accordingly, a vulnerable area 330 shows the region of the substrate that would degrade faster due to higher temperature from the LED source. The temperature upper limit for longer lifetime varies depending on reflective material properties. The upper limit temperature can vary from 90° C. to 150° C. In some embodiments, the vulnerable area, which is from the center of the LED to 1.83*$R_{heat}$, is covered with DA. Due to opacity of the die attach material, in some embodiments, the degraded area covered by the die attach does not negatively affect the performance of the LED device. Therefore, the life span of the whole LED device is prolonged to the targeted 6000 Hours even though the edge area around the LED starts to degrade after less than 4200 hours. Among the many factors that affect the lifespan of the LED package, the degradation of the substrate can be an important limiting factor. Once the substrate degradation occurs, the LOP of the LED package degrades. For example, when the reflectance degrades to 90% of the original value, the performance of the LED package drops considerably. Therefore, prolonging the lifetime of the substrate is important to extend the lifespan of the LED package.

In the foregoing models, the size of the substrate is assumed to be much larger than the size of the LED. Circular shapes are used for both the substrate and the LED to simplify the calculation. When the relative size of the substrate becomes smaller, the circular model is no longer accurate. In other embodiments, other factors may also be considered. One of such factors is the ratio of the size of the substrate over the size of the LED. When the size ratio is large, for example, larger than a predefined ratio threshold, the circular models as shown in 130 is close to an accurate model. As size ratio becomes smaller, the thermal spreader is getting smaller and thereby the adiabatic at the boundary has more effect on the temperature distribution. In such settings, the spreading length is shortened. Further the shape of the isothermal line are not circular.

Figure 4:
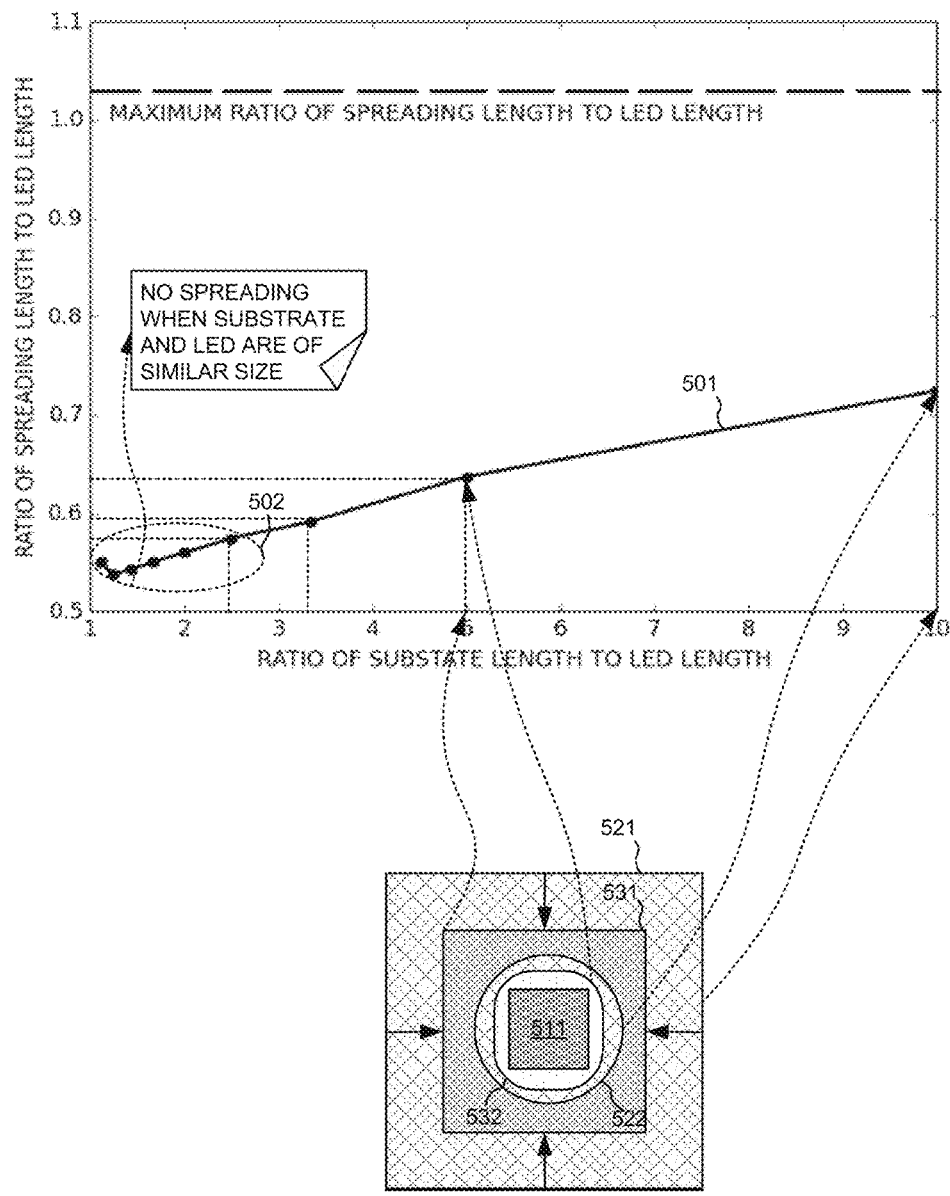
FIG. 4 shows an exemplary diagram of spreading length vs. substrate length and exemplary spreading areas in accordance with some embodiments.

FIG. 4 shows an exemplary diagram of spreading length vs. substrate length and exemplary spreading areas in accordance with embodiments of the current invention. The spreading length is defined as the distance of the point where the temperature increase ($\Delta T$) drops 1/e of that at the LED edge ($\Delta T_0$). The graph shows the spreading length vs. the substrate length. The x-axis of the graph is the ratio of substrate length to the LED length. The y-axis is the ratio of the spreading length to the LED length. The graph illustrates that when the size of the substrate and the size of the LED are similar, there is very little spreading. The diagram is based on the calculation results, which varies with different calculation parameter settings. However, the conclusion, which states that when size is smaller the spreading length is shorter still holds, draw from the analysis does not change. As shown on graph 501, a range 502 illustrates that when the size of the substrate and the size of the LED are similar, there is very little spreading. When the ratio of substrate length to the LED length increases to 10, the ratio of spreading length to the LED length equals to 0.73. Thereby, as the ratio of substrate length to the LED length increase, the circular model renders relatively accurate spreading area. In cases of the ratio of substrate length to the LED length is on the order of 1 (e.g., much smaller than 10), the circular model may no longer accurately represents the spreading area formed by isothermal line. In such cases, the ratio of substrate length to the LED length or the ratio of the size of substrate and the size of the LED should be considered in determining the protected area for the LED.

FIG. 4 further illustrates the changes of the spreading or protected area when the size of the substrate changes. LED 511 is attached to a substrate 521. The ratio of length of substrate 521 to the length of LED 511 is ten. In accordance with graph 501, the ratio of the spreading length to LED length equals to around 0.73. The spreading area is enclosed by a circular isothermal line 522 with a radius about 0.73 times of the size of LED 511. If LED 511 is attached to substrate 531, the size and shape of the spreading changes. Assuming the ratio of length of substrate 531 to the length of the LED is five, in accordance to graph 501, the ratio of the spreading length to the LED length equals to around 0.64. The shape of the isothermal line 532 is no longer circular. Isothermal line 532 becomes more square-like with rounded corners. The spreading area for substrate 531 is enclosed by isothermal line 532.

The ratio of the substrate size to the LED size can be an important factor affecting temperature contour on the substrate, especially when the ratio is small. The size of the substrate plays a bigger role as the ratio decreases. In one embodiment, the ratio of substrate size to the LED size is considered in determining the protected area surrounding the LED that DA is applied.

Figure 5:
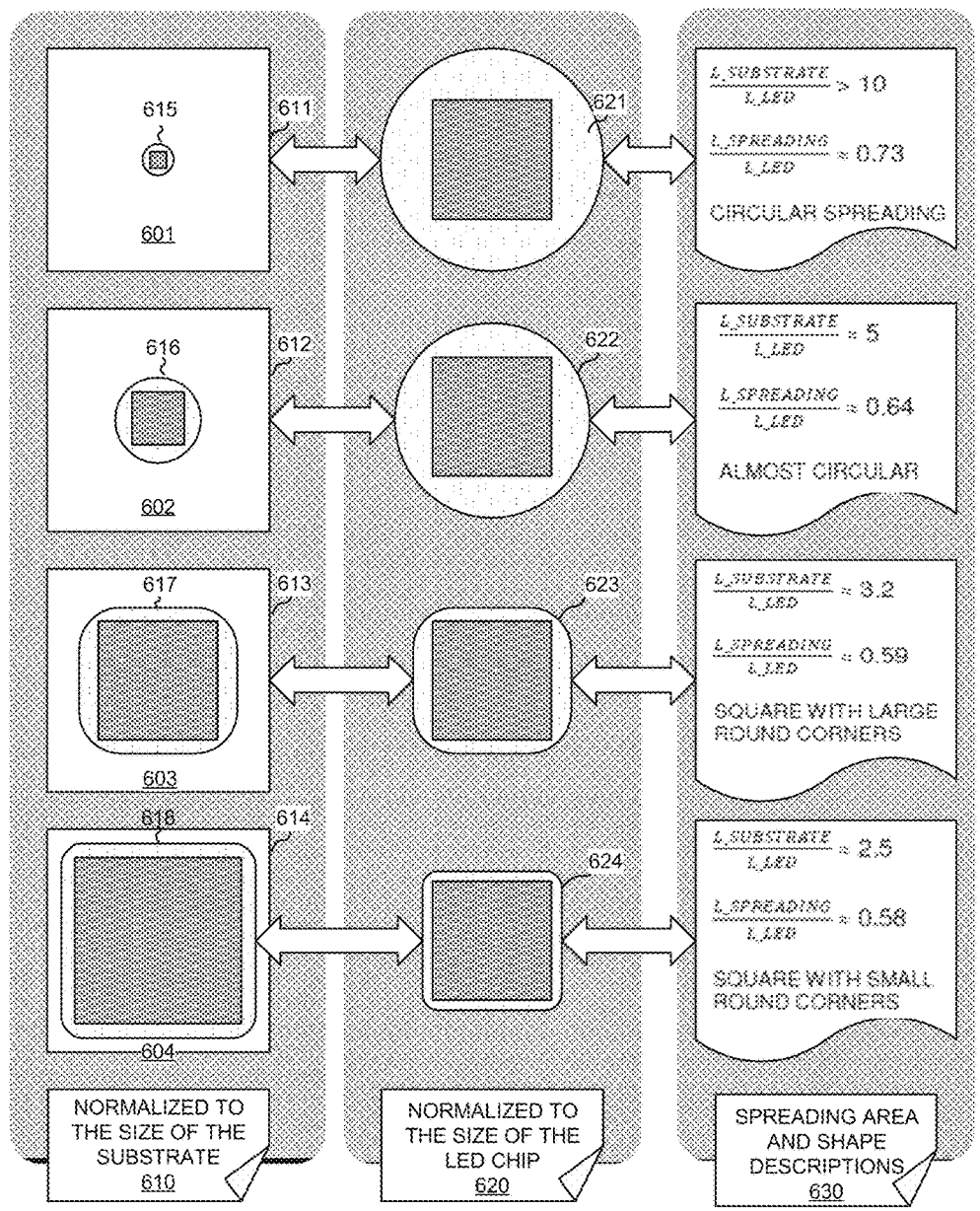
FIG. 5 illustrates spreading area with different ratio of substrate size to LED size in accordance with some embodiments.

FIG. 5 illustrates different perspective of spreading area with different ratio of substrate size to LED size in accordance with certain embodiments. Different perspective of spreading/protected area are shown to illustrate optimized spreading/protected area by further considering the ratio of substrate size to LED size. A group 610 shows exemplary perspective views of different ratios of substrate size to LED size and each perspective view is normalized to the size of the substrate. The exemplary diagrams in group 610 illustrate configuration with the same substrate size with different LED sizes. The size and shape of the spreading/protected area is shown accordingly. Corresponding to each exemplary perspective views in group 610, a group 620 shows the corresponding perspective views, which are normalized to the size of the LED. The exemplary diagrams in group 620 illustrate configuration with the same substrate size with different LED sizes. Corresponding to each exemplary configuration in group 610, the size and shape of the spreading/protected area is shown accordingly. A group 630 provides configuration data to their corresponding diagrams in group 610 and group 620.

Group 620 shows the corresponding perspective views, which are normalized to the size of the LED. LED device 601 has a substrate 611 and a LED die 615. The ratio of substrate length 611 to LED die 615 length is greater than or equals to ten. A corresponding spreading area 621 is shown in group 620 with the normalized size for LED die. Spreading area 621 is encompassed by the predefined isothermal line. In one embodiment, the predefined isothermal line is where the temperature increase equals to (1/e) of the temperature increase at edges of the LED chip. Since the ratio of substrate length to the LED length is large enough the shape of the predefined isothermal line is circular, with the radius equals to about 0.73 times that of the length of the LED 615.

As the ratio of the substrate length to LED die length decreases, the shape and size of the predefined isothermal line changes, resulting in different protected area. LED 602 has a substrate 612 and a LED die 616. The ratio of substrate length 612 to LED die 616 length equals to about five. A corresponding spreading area 622 is shown in group 620 with the normalized size for LED die. Spreading area 622 is encompassed by the predefined isothermal line, which is normally the isothermal line where the temperature increase equals to (1/e) of the temperature increase at edges of the LED die.

As the ratio the substrate length to LED die length continues to decrease, the shape of protected area evolves from circular or almost circular to almost square shape, or rectangle shape in the cases when the LED die is rectangular-shaped. LED 603 has a substrate 613 and a LED chip 617. The ratio of substrate length 613 to LED die 617 length equals to about 3.2. A corresponding spreading area 623 is shown in group 620 with the normalized size for LED chips. Spreading area 623 is encompassed by the predefined isothermal line, which is normally the isothermal line where the temperature equals to (1/e) of the temperature at edges of the LED die. Since the ratio of substrate length to the LED length decreases the shape of the predefined isothermal line changes to almost square with large round corners, with the half length of the spreading area equals to about 0.59 times that of the length of the LED 617.

When the substrate length is similar to the LED length, the spreading area becomes more of a square with smaller spreading length. LED 604 has a substrate 614 and a LED chip 618. The ratio of substrate length 614 to LED chip 618 length equals to about 2.5. A corresponding spreading area 624 is shown in group 620 with the normalized size for LED chips. Spreading area 624 is encompassed by the predefined isothermal line, which is normally the isothermal line where the temperature equals to (1/e) of the temperature at edges of the LED chip. Since the ratio of substrate length to the LED length decreases further, the shape of the predefined isothermal line changes to almost square with small round corners, with the half length of the spreading area equals to about 0.58 times that of the half length of the LED 618.

As illustrated above, the ratio of the substrate size to the LED size can be an important factor in determining the protected area surrounding the LED die, especially when the ratio is small. In some embodiments, the spreading area/protected area is not only affected by the substrate size, but also limited by the distance from other LED chips on the same substrate.

Figure 6:
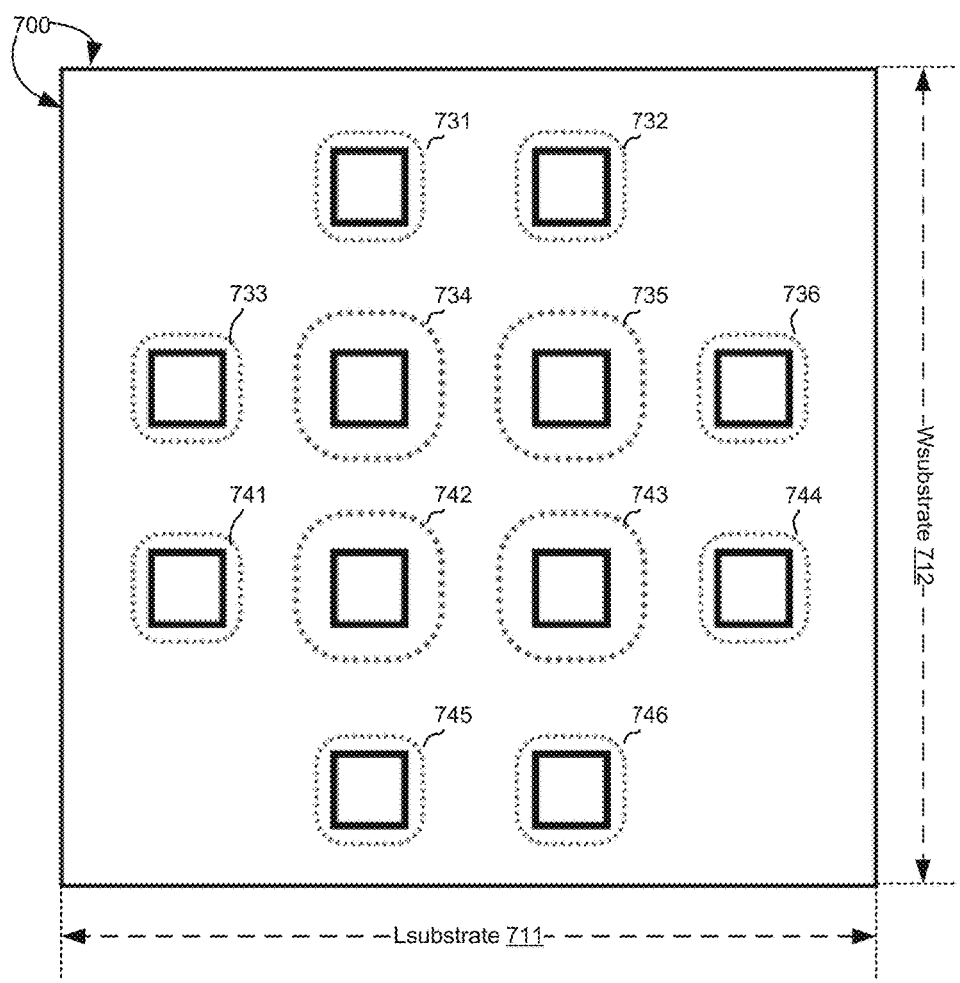
FIG. 6 illustrates spreading area limited by multiple LEDs in accordance with some embodiments.

FIG. 6 illustrates spreading area limited by multiple LEDs in accordance to embodiments of the current invention. A LED package 700 includes a substrate with a length 711 of $L_{substrate}$ and a width 712 of $W_{substrate}$. For LED packages, the temperature distribution around the LED may depend on surrounding LEDs. Therefore, the die attach should cover a wider area when the LED is surrounded by other close-by LEDs. As shown, LEDs 731 to 736 and 741 to 746 are LEDs in a LED package. LEDs 731, 732, 733, 741, 736, 744, 74 and 746 are at the edge of the LED package, therefore, the absolute temperatures around these LED are lower than the ones at the center of the LED package, such as LEDs 734, 735, 742 and 743. Since the LEDs at the edge of the LED package have relatively lower temperature than the ones at the center of the LED package, the edge LEDs has a smaller die attach coverage area than the center LEDs. In other embodiments, different LEDs layouts can be used. In some cases, the die attach coverage areas may be determined by the absolute temperature distribution around the each LED.

Figure 7:
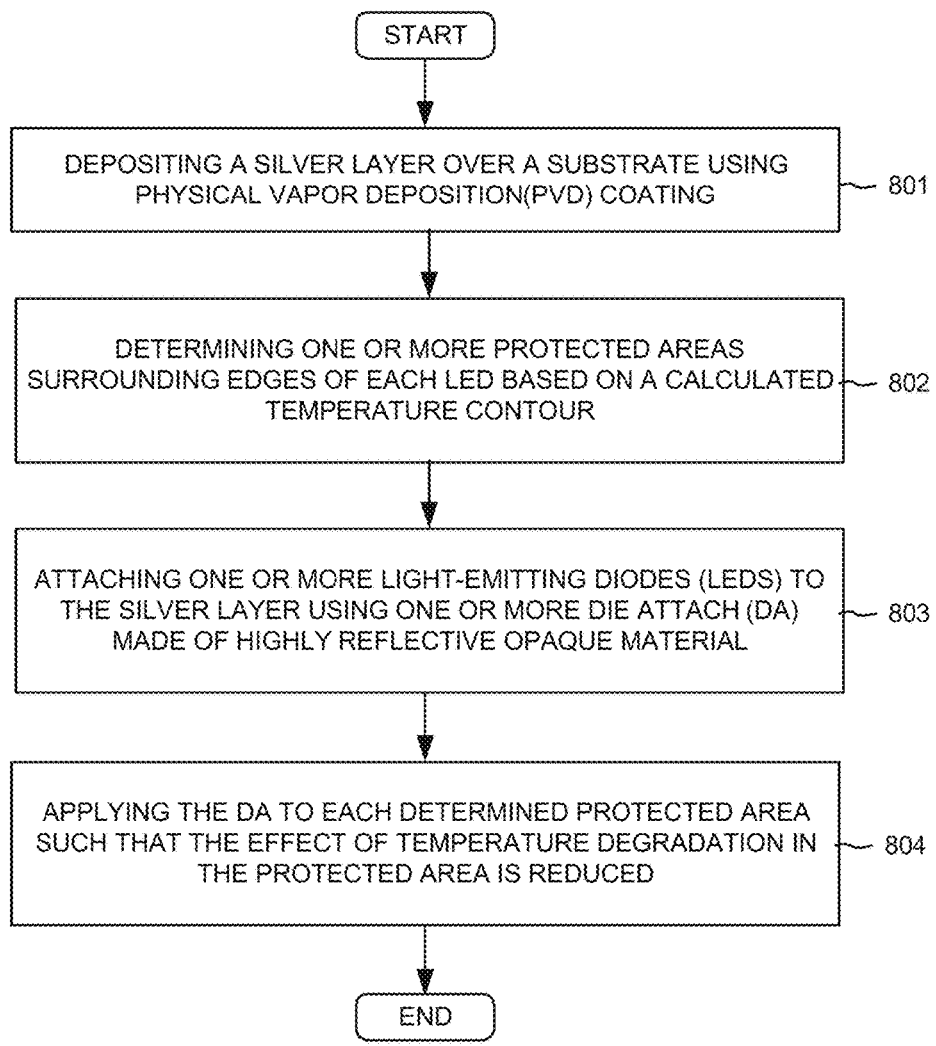
FIG. 7 is an exemplary flow chart for applying DA material to a determined protected area such that the LED package is protected from temperature degradation in accordance with some embodiments.

FIG. 7 is an exemplary flow chart for a method of applying die attach material to a determined protected area such the LED device is protected from temperature degradation in accordance with certain embodiments. It should be understood that other methods are also within scope of this disclosure. In the illustrative embodiment, step 801 deposits a silver layer over a substrate using physical vapor deposition (PVD) coating and deposit protection layers. Step 802 determines one or more protected areas surrounding edges of each LED based on a predefined temperature contour. Step 803 attaches one or more light-emitting diodes (LEDs) to the silver layer using one or more die attach made of highly reflective opaque material. Step 804 applies the die attach to each determined protected area such that the protected area of each corresponding LED is protected from temperature degradation.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A light emitting device, comprising:
a substrate including a reflective region disposed at a top surface of the substrate, wherein the reflective region comprises at least one reflective layer;
a light emitting diode having a periphery defined by edges; and
a die attach covering a portion of the top surface of the substrate, the die attach attaching the light emitting diode to the top surface of the substrate, wherein the die attach comprises a reflective material, and wherein the die attach extends beyond the periphery of the light emitting diode to cover an area of the top surface of the substrate that is outside the periphery of the light emitting diode,
wherein the temperature of the substrate beneath the edges of the light emitting diode increases when the light emitting diode emits light and heat is spread across the substrate to create a temperature distribution from a higher temperature beneath the edges of the light emitting diode to lower temperatures at a distance from the edges of the light emitting diode, the die attach covers a pre-determined area on the top surface of the substrate and the pre-determined area covers an area underneath the light emitting diode and between edges of the light emitting diode and an isothermal line when the light emitting diode emits light, wherein the isothermal line is the isothermal line that the temperature increase drops to 1/e of the temperature increase at the edges of the light emitting diode.

2. The light emitting device of claim 1, wherein the at least one reflective layer comprises silver.

3. The light emitting device of claim 1, wherein the at least one reflective layer is deposited using physical vapor deposition.

4. The light emitting device of claim 1, wherein the reflective region comprises a plurality of layers.

5. The light emitting device of claim 1, wherein the die attach comprises a polymeric material and reflective particles distributed in the polymeric material.

6. The light emitting device of claim 5, wherein the polymeric material comprises silicone.

7. The light emitting device of claim 5, wherein the reflective particles comprise particles selected from the group consisting of $T_iO_2$, $Zr_2O_3$, $Al_2O_3$, ZnO, and combinations thereof.

8. The light emitting device of claim 1, wherein the pre-determined area is determined using a heat distribution model.

9. The light emitting device of claim 1, wherein the isothermal line is determined, in part, by a shape of the LED.

10. The light emitting device of claim 1, wherein the isothermal line is determined, in part, by a ratio of an area of the LED over an area of the substrate.

11. The light emitting device of claim 1, further comprising:
- a second light emitting diode having a periphery defined by edges and
- a second die attach covering a portion of the top surface of the substrate, the second die attach attaching the second light emitting diode to the top surface of the substrate, wherein the second die attach comprises reflective material, and wherein the second die attach extends beyond the periphery of the second light emitting diode to cover an area of the top surface of the substrate that is outside the periphery of the second light emitting diode.

12. The light emitting device of claim 1, wherein the die attach reduces degradation of the substrate.

13. The light emitting device of claim 1, wherein the die attach extends beyond the periphery of the light emitting diode to cover an area of the top surface of the substrate that is at least 20% of the area defined by the periphery of the light emitting diode.

14. The light emitting device of claim 1, wherein the reflective material is opaque.

\* \* \* \* \*